(12) United States Patent
Furuya et al.

(10) Patent No.: US 12,400,841 B2
(45) Date of Patent: Aug. 26, 2025

(54) TRAP DEVICE AND SEMICONDUCTOR MANUFACTURING DEVICE

(71) Applicant: Tokyo Electron Limited, Tokyo (JP)

(72) Inventors: Yuichi Furuya, Yamanashi (JP); Hiroki Sakabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 446 days.

(21) Appl. No.: 18/002,334

(22) PCT Filed: Jun. 10, 2021

(86) PCT No.: PCT/JP2021/022090
§ 371 (c)(1),
(2) Date: Dec. 19, 2022

(87) PCT Pub. No.: WO2021/261268
PCT Pub. Date: Dec. 30, 2021

(65) Prior Publication Data
US 2023/0360895 A1 Nov. 9, 2023

(30) Foreign Application Priority Data
Jun. 22, 2020 (JP) .................... 2020-107117

(51) Int. Cl.
*H01J 37/32* (2006.01)
*B01D 8/00* (2006.01)
*C23C 16/44* (2006.01)

(52) U.S. Cl.
CPC .......... *H01J 37/32844* (2013.01); *B01D 8/00* (2013.01); *C23C 16/4412* (2013.01); *H01J 2237/002* (2013.01); *H01J 2237/3321* (2013.01)

(58) Field of Classification Search
CPC .......... H01J 37/32844; H01J 2237/002; H01J 2237/3321; B01D 8/00; B01D 53/002;
(Continued)

(56) References Cited

U.S. PATENT DOCUMENTS 1,514,441 A * 11/1924 Culp ................. F01N 1/084
  55/417
3,483,980 A * 12/1969 Cochran ............. G21C 19/313
  210/186
(Continued)

FOREIGN PATENT DOCUMENTS

JP   H11-300153    11/1999
JP   2004-305950   11/2004
(Continued)

*Primary Examiner* — Rudy Zervigon
(74) *Attorney, Agent, or Firm* — IPUSA, PLLC

(57) ABSTRACT

A trap device including an exhaust gas introduction pipe configured to allow an exhaust gas to flow and be led out from an outlet; a fin member provided in a position where the fin member faces the outlet and is hit by the exhaust gas led out from the outlet; an exhaust path forming member covering at least a portion of the exhaust gas introduction pipe and including an exhaust path configured to exhaust the exhaust gas such that the exhaust gas is turned back, via the fin member, in an opposite direction to a direction of flow of the exhaust gas in the exhaust gas introduction pipe; and a cooling jacket configured to cool the fin member is provided. The fin member includes a fin extending in the opposite direction to the direction of the flow of the exhaust gas in the exhaust gas introduction pipe.

9 Claims, 6 Drawing Sheets

(58) Field of Classification Search
CPC ............. C23C 16/4412; H01L 21/3065; H01L 21/67017; H01L 21/67109
USPC ......... 156/345.29; 55/DIG. 15, 434.2, 434.4, 55/385.2, 282.2, 423, 438, 440; 95/288, 95/1, 14, 229, 270; 118/715, 719, 722, 118/724; 96/266
See application file for complete search history.

(56) References Cited

U.S. PATENT DOCUMENTS

| | | | |
|---|---|---|---|
| 5,405,445 A * | 4/1995 | Kumada | C23C 16/4412 118/724 |
| 5,820,641 A * | 10/1998 | Gu | B01D 53/002 55/DIG. 15 |
| 6,045,618 A * | 4/2000 | Raoux | B01D 45/06 55/284 |
| 6,156,107 A * | 12/2000 | Hayashi | B01D 45/08 438/905 |
| 6,187,072 B1 * | 2/2001 | Cheung | C23C 16/4405 118/715 |
| 6,193,802 B1 * | 2/2001 | Pang | H01J 37/32844 118/723 R |
| 6,197,119 B1 * | 3/2001 | Dozoretz | H01J 37/32844 55/525 |
| 6,238,514 B1 * | 5/2001 | Gu | H01J 37/32844 118/715 |
| 6,303,006 B1 * | 10/2001 | Chang | B01D 3/10 202/205 |
| 6,488,745 B2 * | 12/2002 | Gu | B01D 8/00 55/DIG. 15 |
| 7,044,997 B2 * | 5/2006 | Mardian | B01D 5/0006 96/417 |
| 7,727,296 B2 * | 6/2010 | Tojo | B01D 45/06 438/905 |
| 10,036,090 B2 * | 7/2018 | Komori | C23C 16/18 |
| 10,369,506 B1 * | 8/2019 | Hakki | B01D 53/504 |
| 2001/0003892 A1 * | 6/2001 | Rikyuu | C23C 16/4412 55/444 |
| 2003/0198578 A1 * | 10/2003 | Lee | C23C 16/452 422/138 |
| 2006/0162862 A1 | 7/2006 | Park | |
| 2011/0045182 A1 * | 2/2011 | Fukumori | C23C 16/4412 118/724 |
| 2021/0291222 A1 * | 9/2021 | Nishi | H01L 21/67017 |
| 2023/0360895 A1 * | 11/2023 | Furuya | C23C 16/4412 |

FOREIGN PATENT DOCUMENTS

| | | | | |
|---|---|---|---|---|
| JP | 2009-016635 | | 1/2009 | |
| JP | 2013227648 A | * | 11/2013 | ............. C23C 16/18 |

* cited by examiner

TRAP DEVICE AND SEMICONDUCTOR MANUFACTURING DEVICE

TECHNICAL FIELD

The present disclosure relates to trap devices and semiconductor manufacturing devices.

BACKGROUND ART

For example, Patent Document 1 proposes an exhaust trap in which a trap container with an inlet and outlet for an exhaust gas houses a filtration-media-filled filter with a cross-sectional area larger than the inlet, and a space is provided between the inlet and the filtration-media-filled filter. The space between the inlet and the filtration-media-filled filter allows the exhaust gas that is introduced from the inlet to reach the filtration-media-filled filter after having spread in the space. As a result, it is possible to reduce clogging of the filtration-media-filled filter, and thus prolong the life of the exhaust trap.

For example, Patent Document 2 proposes a substrate processing apparatus that includes an exhaust system configured to exhaust gas without byproducts by cooling the inside of a trap provided in the exhaust system to reduce the temperature of the exhaust gas.

PRIOR ART DOCUMENT

Patent Document

[Patent Document 1] Japanese Laid-Open Patent Application Publication No. 2004-305950

[Patent Document 2] Japanese Laid-Open Patent Application Publication No. 2009-16635

SUMMARY OF THE INVENTION

Problem to be Solved by the Invention

The present disclosure provides a trap device and a semiconductor manufacturing device capable of increasing the entrapment efficiency of byproducts contained in an exhaust gas.

Means for Solving the Problem

According to one aspect of the present disclosure a trap device includes an exhaust gas introduction pipe configured to allow an exhaust gas to flow and be led out from an outlet; a fin member provided in a position where the fin member faces the outlet and is hit by the exhaust gas led out from the outlet; an exhaust path forming member covering at least a portion of the exhaust gas introduction pipe and including an exhaust path configured to exhaust the exhaust gas such that the exhaust gas is turned back, via the fin member, in an opposite direction to a direction of flow of the exhaust gas in the exhaust gas introduction pipe; and a cooling jacket configured to cool the fin member, wherein the fin member includes a fin extending in the opposite direction to the direction of the flow of the exhaust gas in the exhaust gas introduction pipe.

Effects of the Invention

According to one aspect, it is possible to increase the entrapment efficiency of byproducts contained in an exhaust gas.

DESCRIPTION OF THE EMBODIMENTS

Figure 1:
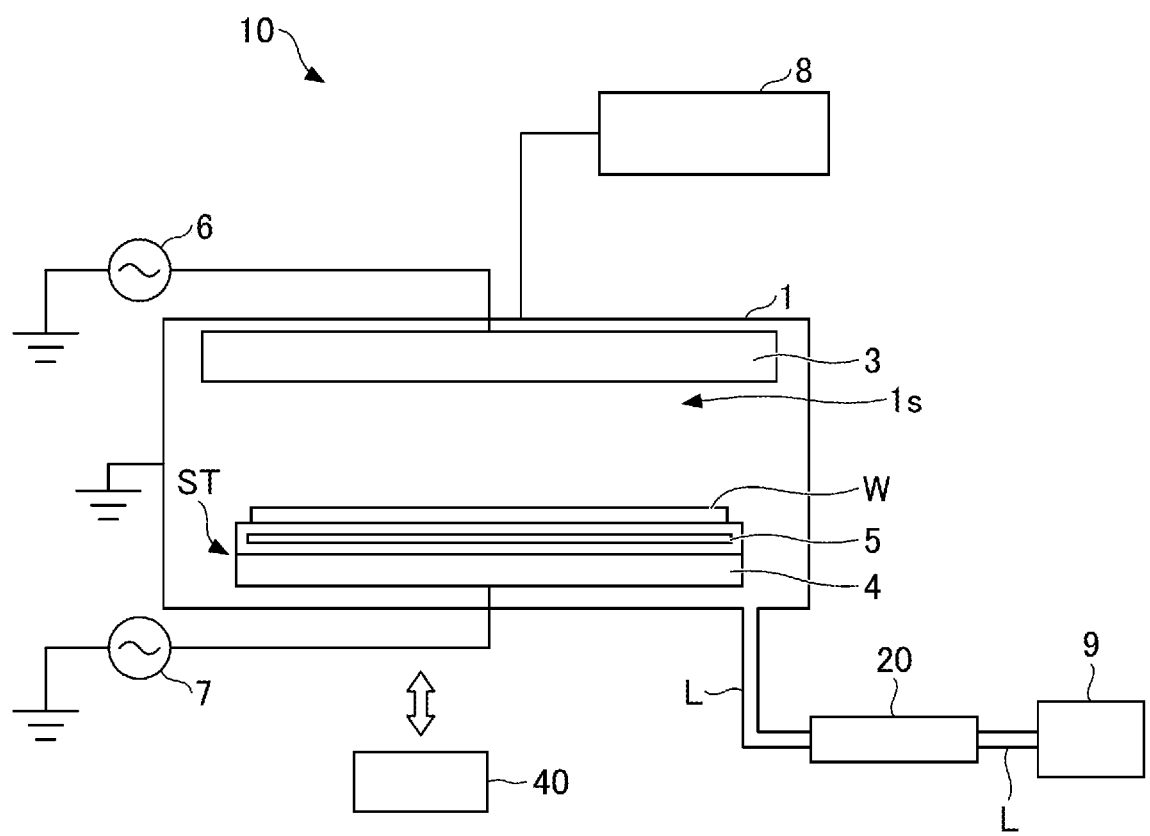
FIG. 1 is a schematic cross-sectional view illustrating an example of a semiconductor manufacturing device according to the first and second embodiments.

Embodiments of the present disclosure will be described hereinafter with reference to the accompanying drawings. Note that the same reference numerals are used to denote the same components throughout the drawings, and a repetitive description thereof will be omitted.

[Semiconductor Manufacturing Device]

A semiconductor manufacturing device 10 according to the first and second embodiments will be described first with reference to FIG. 1. FIG. 1 is a schematic cross-sectional view illustrating an example of the semiconductor manufacturing device 10 according to the first and second embodiments. FIG. 1 illustrates a capacitively coupled plasma chemical vapor deposition (CVD) apparatus.

The semiconductor manufacturing device 10 includes a chamber 1, and a processing space 1s where deposition processes and etching processes are performed is provided in the chamber 1. In the semiconductor manufacturing device 10, plasma is formed between an upper electrode 3 and a stage ST in the chamber 1, and a substrate W is processed by the plasma acting on the substrate W. The stage ST includes a lower electrode 4 and an electrostatic chuck 5. The stage ST may include a heater. The substrate W is held above the lower electrode 4. An RF power supply 6 and an RF power supply 7 are coupled to both the upper electrode 3 and the lower electrode 4, and different RF frequencies can be used. Alternatively, the RF power supply 6 and the RF power supply 7 may be coupled to the same electrode. Further, a direct current (DC) power supply may be coupled to the upper electrode 3. The chamber 1 is connected to a gas supply 8, and processing gas is supplied to the processing space 1s. An exhaust device 9 is also connected to the chamber 1 and exhausts the air in the chamber 1. A trap device 20 is provided in a gas exhaust line L that is disposed between the chamber 1 and the exhaust device 9, and the trap device 20 traps byproducts contained in the exhaust gas. The trap device 20 may be provided, for example, between a turbomolecular pump and a dry pump that serve as examples of the exhaust device 9.

The semiconductor manufacturing device 10 includes a controller 40 that includes a processor and a memory. The controller 40 controls each component of the semiconductor manufacturing device 10 to perform plasma processing such as deposition processes on the substrate W.

First Embodiment

[Trap Device]

Figure 2:
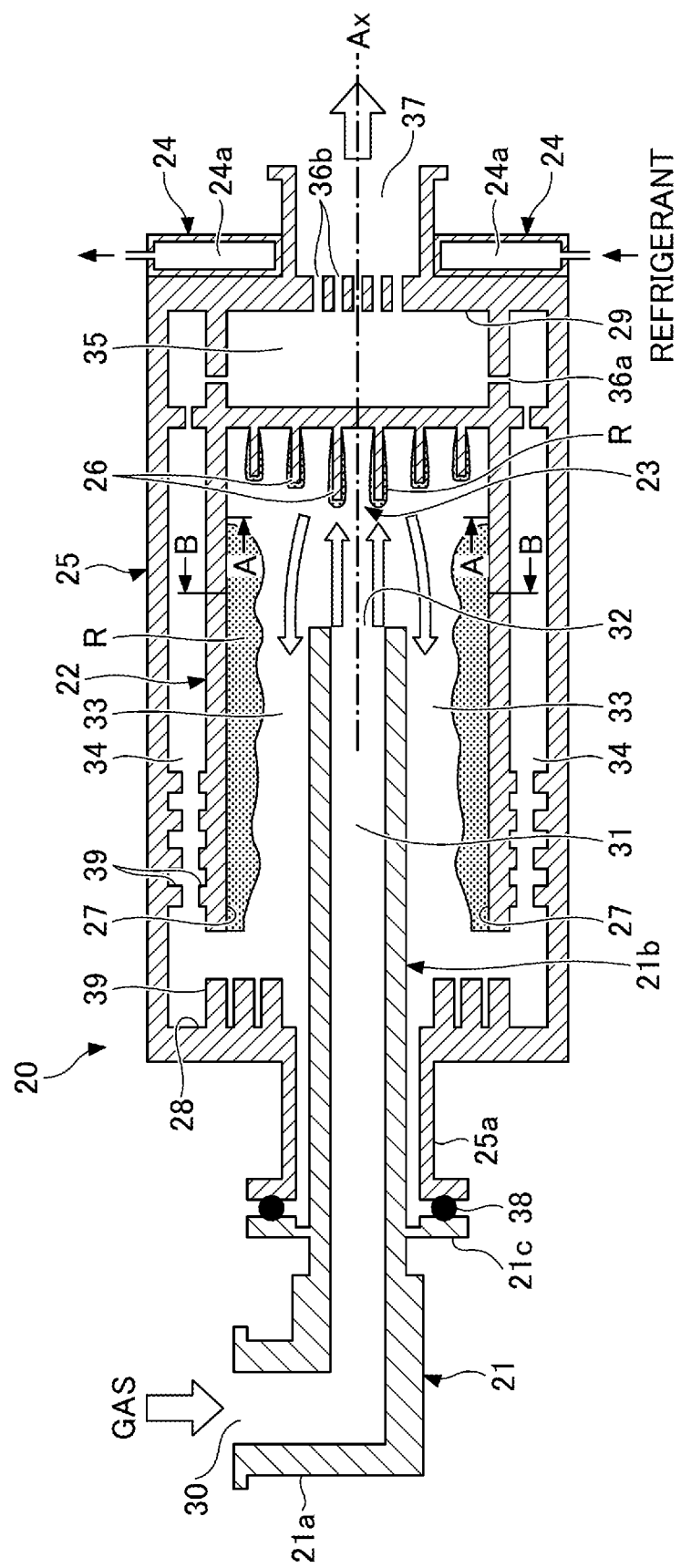
FIG. 2 is a vertical cross-sectional view of a trap device according to the first embodiment.
Figure 3A:
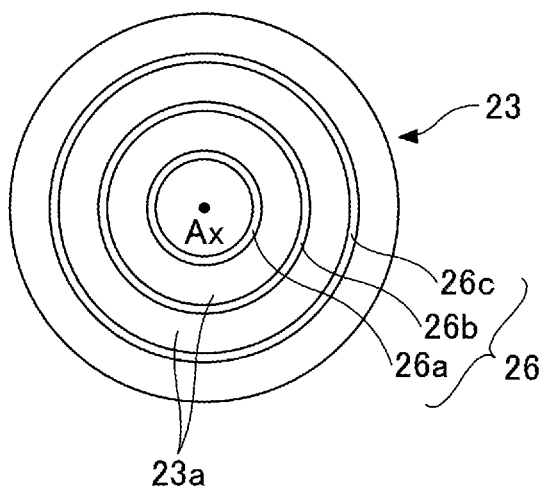
FIG. 3A is a view illustrating a fin member in the trap device according to the first embodiment.
Figure 3B:
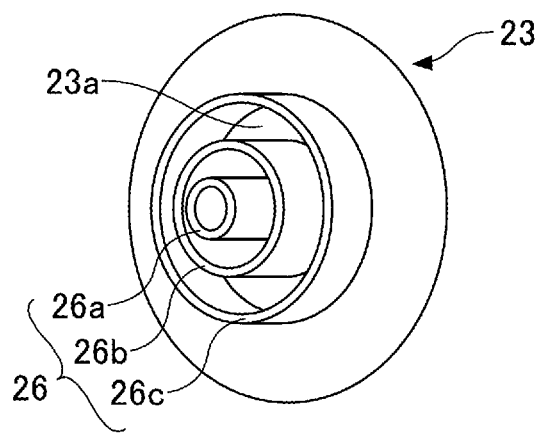
FIG. 3B is a view illustrating the fin member in the trap device according to the first embodiment.
Figure 4:
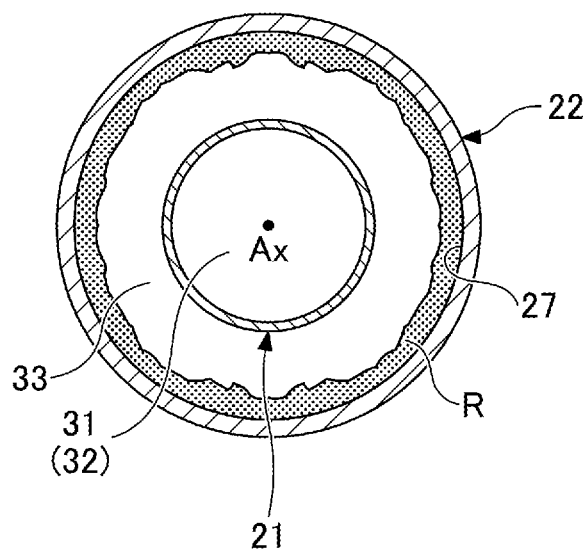
FIG. 4 is a view of an exhaust path in the trap device taken along a B-B plane of FIG. 2.

The configuration of the trap device 20 according to the first embodiment will be described next with reference to FIGS. 2 to 4. FIG. 2 is a vertical cross-sectional view of the trap device 20 according to the first embodiment. FIGS. 3A and 3B are views each illustrating a fin member 23 in the trap device 20 according to the first embodiment. FIG. 3A is a plan view of the fin member 23 according to the first embodiment and is taken along a plane A-A of FIG. 2. FIG. 3B is a perspective view of the fin member 23 according to the first embodiment. FIG. 4 is a cross-sectional view taken along a plane B-B of FIG. 2 and is a view illustrating the periphery of a second exhaust path 33 in the trap device 20.

The trap device 20 is a device configured to resolidify and trap byproducts contained in an exhaust gas that is exhausted when processing gas is used to perform deposition or etching on the substrate W in the processing space 1s of the chamber 1. The byproducts contained in the exhaust gas include, for example, precursor materials that were not used in deposition. For example, in a case where a ruthenium film is deposited on the substrate W by using a $Ru_3(CO)_{12}$ process gas (precursor gas), byproducts such as ruthenium and the like are contained in the exhaust gas. In such a case, the trap device 20 traps the ruthenium and the like contained in the exhaust gas.

Releasing the byproducts contained in the exhaust gas directly into the atmosphere causes environmental pollution. Further, depending on the type of the exhaust gas, deposits may be generated inside the exhaust system. This may, for example, reduce the conductance of the gas exhaust line L or cause the exhaust device 9 to break down.

Hence, to exhaust the process gas that was not used in deposition, the trap device 20 is provided in an exhaust system such as the gas exhaust line L. The exhaust gas flowing in the trap device 20 is cooled to resolidify the byproducts, and the resolidified byproducts are trapped. Therefore, the trap device 20 according to the embodiment focuses on the flow of the exhaust gas in the trap device 20 to improve the efficiency of trapping byproducts, and thus a configuration that can create a flow of exhaust gas to trap byproducts efficiently is proposed.

More specifically, as illustrated in FIG. 2, the trap device 20 includes an exhaust gas introduction pipe 21, an exhaust path forming member 22, the fin member 23, a cooling jacket 24, and a housing 25. The exhaust gas introduction pipe 21 has an L-shaped vertical cross-section, and includes a pipe 21a, a pipe 21b, an inlet 30, and an outlet 32. The pipe 21a includes the inlet 30 for the exhaust gas, and the pipe 21b includes the outlet 32 for the exhaust gas.

The pipe 21a extends in a vertical direction, and the inlet 30 opens upward at one end of the pipe 21a. The other end of the pipe 21a is connected to one end of the pipe 21b that is provided substantially perpendicular to the pipe 21a. The pipe 21b extends in a horizontal direction, and the outlet 32 opens sideways in the other end of the pipe 21b. The exhaust gas is introduced to the exhaust gas introduction pipe 21 from the inlet 30 via the gas exhaust line L.

The pipe 21a and the pipe 21b are cylindrical, and the length of the pipe 21b is longer than the length of the pipe 21a. The central axis of the pipe 21b substantially matches a central axis Ax of the trap device 20. Assume hereinafter that "substantially matches" includes deviations due to the precision of machining.

The exhaust gas introduction pipe 21 is preferably made of metal such as aluminum, an aluminum alloy, or stainless steel. The exhaust gas introduction pipe 21 includes a heater and is able to heat the exhaust gas that passes through the exhaust gas introduction pipe 21. The exhaust gas passes a first exhaust path 31 in the exhaust gas introduction pipe 21 through the inlet 30, and is led out into the trap device 20 from the outlet 32. The exhaust gas is heated as it passes the first exhaust path 31.

The other end (the outlet 32) of the exhaust gas introduction pipe 21 is inserted into the housing 25, and the one end (the inlet 30) of the exhaust gas introduction pipe 21 is exposed from the housing 25. A ring-shaped protrusion 21c is formed on the exposed portion of the exhaust gas introduction pipe 21. An O-ring 38 is provided between the protrusion 21c and an engagement portion 25a that is provided on the one end of the housing 25 and extends along the outer periphery of the exhaust gas introduction pipe 21. The O-ring 38 keeps the housing 25 airtight and prevents the exhaust gas and the resolidified byproducts from leaking outside of the trap device 20 from between the exhaust gas introduction pipe 21 and the housing 25. An exhaust vent 37 for the exhaust gas is formed on the other end of the housing 25.

The housing 25 is preferably made of metal such as aluminum, an aluminum alloy, or stainless steel. The cooling jacket 24 is provided externally to the housing 25 and is provided along the housing 25 around the exhaust vent 37. The cooling jacket 24 includes a flow path 24a, and the housing 25, the exhaust path forming member 22, and the fin member 23 are cooled by a refrigerant such as a coolant that flows in the flow path 24a.

The housing 25 is cylindrical and includes the exhaust path forming member 22. The exhaust path forming member 22 is cylindrical and is of a diameter smaller than that of the housing 25. The exhaust path forming member 22 is preferably made of aluminum, an aluminum alloy, or stainless steel. The exhaust path forming member 22 is fixed to the housing 25.

The diameter of the exhaust path forming member 22 is larger than the diameter of the pipe 21b, and the exhaust path forming member 22 is disposed so as to cover at least a portion of the pipe 21b. The central axes of the pipe 21b, the exhaust path forming member 22, and the housing 25 substantially coincide with the central axis Ax. That is, the pipe 21b, the exhaust path forming member 22, and the housing 25 are arranged concentrically about the central axis Ax.

The exhaust path forming member 22 is provided between the pipe 21b and the housing 25, and covers the pipe 21b from the side where the outlet 32 is inserted in the housing 25. As a result, a second exhaust path 33, which is defined by the outer surface of the pipe 21b and the inner surface of the exhaust path forming member 22, is formed between the pipe 21b and the exhaust path forming member 22. A third exhaust path 34, which is defined by the outer surface of the exhaust path forming member 22 and the inner surface of the housing 25, is formed between the exhaust path forming member 22 and the housing 25. The first exhaust path 31, the second exhaust path 33, and the third exhaust path 34 are formed from the inner side in this order in the horizontal direction.

The exhaust path forming member 22 is shaped like a cylinder with a base. The fin member 23 is attached to the base of the exhaust path forming member 22. The fin member 23 attached to the base of the exhaust path forming member 22 is disposed to face the outlet 32 of the pipe 21b such that the exhaust gas led out from the outlet 32 hits the fin member 23. For example, the fin member 23 is disposed in a position where the exhaust gas led out from the outlet 32 hits the fin member 23 at a substantially right angle.

The fin member 23 includes fins 26 that extend in an opposite direction to the direction of the flow of the exhaust gas in the exhaust gas introduction pipe 21. FIG. 3A is a plan view of the fins 26 taken along a plane A-A of FIG. 2. Further, FIG. 3B is a perspective view of the fins 26.

The fins 26 include three fins 26a, 26b, and 26c. These fins 26a, 26b, and 26c may be referred to collectively as the fins 26 hereinafter. The fins 26a, 26b, and 26c are ring-shaped members with different diameters from each other, are arranged concentrically about the central axis Ax, and are disposed spaced apart from each other at equal intervals in a radial direction. The fins 26a, 26b, and 26c are configured to have diameters such that the diameter of the fin 26a is smallest, the diameter of the fin 26b is larger than the diameter of the fin 26a, and the diameter of the fin 26c is largest.

The fins 26a, 26b, and 26c are configured such that the respective lengths by which the fins 26a, 26b, and 26c extend from a base 23a of the fin member 23 are longer toward an inner fin. That is, the length by which the fin 26 extends toward the pipe 21b is longest for the innermost fin 26a, followed by the middle fin 26b, and the outermost fin 26c in this order. Although three fins 26 are illustrated in FIGS. 2, 3A, and 3B, the number of fins are not limited to this, and one, two, or four or more fins may be provided.

Note, however, that the fins 26a, 26b, and 26c may be configured such that the respective lengths of extension from the base 23a of the fin member 23 are the same or such that the respective lengths of extension from the base 23a of the fin member 23 are longer toward an outer fin. Alternatively, the middle fin 26b may be configured to be longer or shorter than the innermost fin 26a and the outermost fin 26c.

In the fin member 23 according to such a configuration, the length by which each fin 26 extends from the base 23a of the fin member 23 is designed to be an appropriate length such that the exhaust gas led out from the outlet 32 of the pipe 21b is able to hit the fins 26a, 26b, and 26c. That is, the fins 26a, 26b, and 26c extend toward the outlet 32 while being spaced apart from the outlet 32 by an appropriate distance. Hence, the exhaust gas led out from the outlet 32 hits the base 23a of the fins 26a, 26b, and 26c at a substantially right angle, thus creating a flow of the exhaust gas in the fin member 23. The flow is created by turning back the exhaust gas in the fin member 23 in the opposite direction to the direction of the flow of the exhaust gas in the first exhaust path 31 of the pipe 21b. As a result, the exhaust gas led out from the outlet 32 hits the fin member 23 and is turned back inside of the fin member 23 in the direction of the second exhaust path 33, thus causing the exhaust gas to flow into the second exhaust path 33.

The exhaust gas is heated by a heater while being passed through the exhaust gas introduction pipe 21 and is led out from the outlet 32. The exhaust gas that is exhausted is cooled inside of the fin member 23 and by a trap surface 27, which is the inner surface of the exhaust path forming member 22 forming the second exhaust path 33. The inside of the fin member 23 and the trap surface 27 are cooled by a refrigerant such as a coolant flowing in the flow path 24a.

As a result, the byproducts contained in the exhaust gas resolidify, and subsequently adhere to and are deposited on the surfaces of the fins 26a, 26b, and 26c, and the trap surface 27 of the exhaust path forming member 22. This allows the byproducts contained in the exhaust gas to be resolidified and trapped. In FIG. 2, the byproducts trapped by the trap device 20 are indicated as byproducts R. Note, however, that the entrapment locations of the byproducts R illustrated in FIG. 2 are merely examples.

Particularly, in this embodiment, the exhaust gas sufficiently hits the fin member 23 that extends in the opposite direction to the direction of the flow of the exhaust gas led out from the outlet 32, thus creating a flow of the exhaust gas in the fin member 23. As a result, the resolidified byproducts R can adhere more easily to the surface of the plurality of fins 26a, 26b, and 26c, and the entrapment efficiency of the byproducts R contained in the exhaust gas can be increased. Furthermore, the exhaust gas is turned back inside of the fin member 23 and flows into the second exhaust path 33, thus causing the resolidified byproducts R to be deposited on the trap surface 27 when the exhaust gas flows through the second exhaust path 33. An example of the result of such a process is illustrated in a cross-sectional view taken along a plane B-B of FIG. 2 in FIG. 4. As illustrated in FIG. 4, the byproducts R contained the exhaust gas are trapped by the trap surface 27 of the exhaust path forming member 22.

The byproducts R contained in the exhaust gas are resolidified, are trapped by the trap surface 27 while passing through the second exhaust path 33, are turned back again upon hitting a surface 28 (see FIG. 2) of the housing 25 facing the fin member 23, and flow through the third exhaust path 34. The inner surface of the housing 25 and the outer surface of the exhaust path forming member 22, which form the third exhaust path 34, and the surface 28 may have protrusions 39 formed thereon. The formation of the protrusions 39 increases the surface areas of the housing 25 and the exhaust path forming member 22 that are cooled by the cooling jacket 24, thereby increasing the cooling efficiency of the exhaust gas and promoting the resolidification of the byproducts R contained in the exhaust gas.

The exhaust gas that flowed through the third exhaust path 34 passes through slits 36a and flows into a fourth exhaust path 35 formed perpendicular to the third exhaust path 34. The exhaust gas changes its flow to a direction perpendicular to the third exhaust path 34 along a surface 29 of the housing 25 where the exhaust vent 37 is formed, and the exhaust gas flows through the fourth exhaust path 35 toward the inner portion (the center) of the surface 29. The surface 29 includes a circular opening at its center, and connects to the exhaust vent 37 through slits 36b provided at the opening. The exhaust gas that flowed through the fourth exhaust path 35 is exhausted from the exhaust vent 37 via the slits 36b.

According to the trap device 20 of the first embodiment described above, the exhaust gas that flows through the first exhaust path 31 hits the base 23a of the fins 26 at a substantially right angle and is turned back inside the fins 26 to flow in the opposite direction of the flow of the first exhaust path 31 to flow into the second exhaust path 33. This configuration allows the exhaust gas to flow into the deep portions of the fins 26, thus creating a flow of the exhaust gas inside of the fins 26. Hence, the amount of byproducts R trapped by the fin member 23 can be increased. As a result, the efficiency by which the byproducts R are trapped by the trap device 20 can be improved. Furthermore, by providing a configuration in which the exhaust gas that is turned back by being passed through the fin member 23 flows through the second exhaust path 33, the entrapment efficiency of the trap surface 27 can be improved. As a result, it is possible to increase the life of the trap device 20.

Second Embodiment

[Trap Device]

Figure 5:
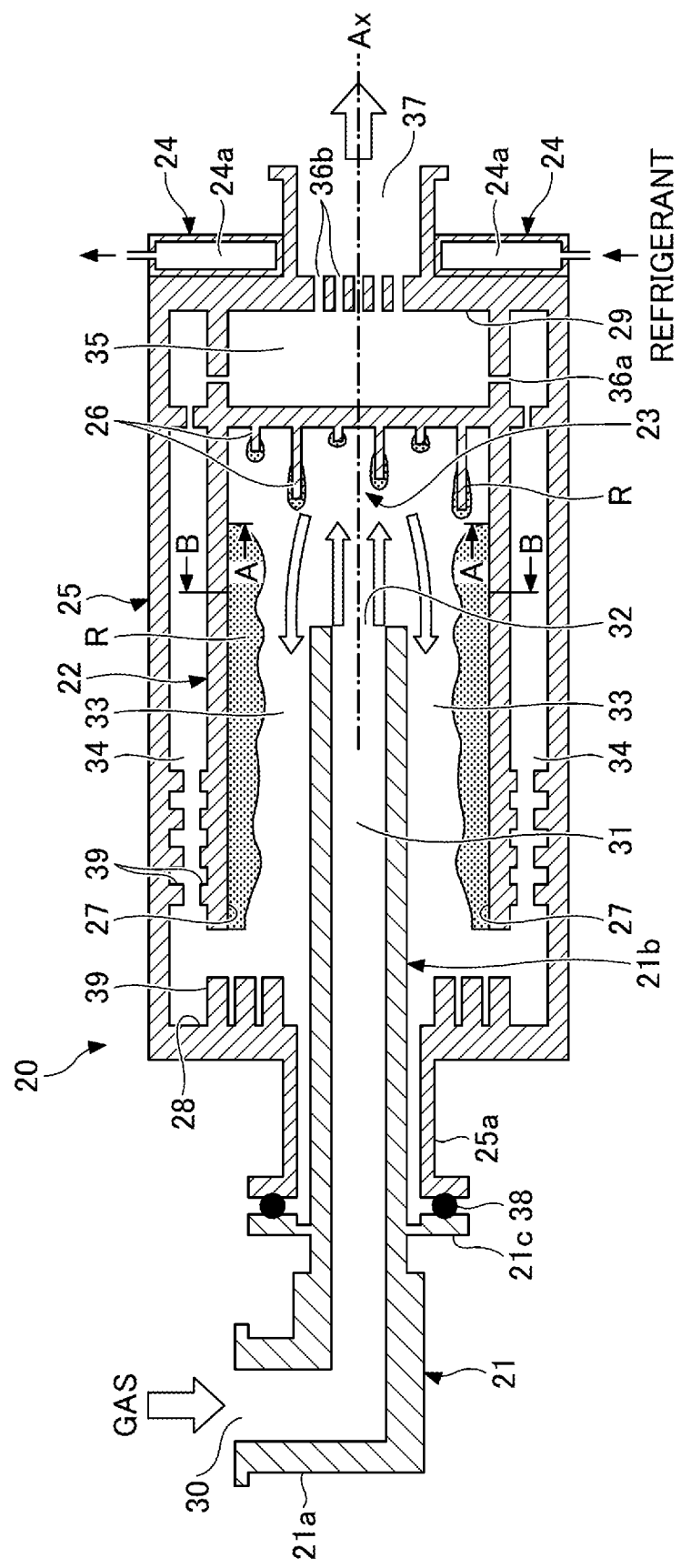
FIG. 5 is a vertical cross-sectional view of the trap device according to the second embodiment.
Figure 6A:
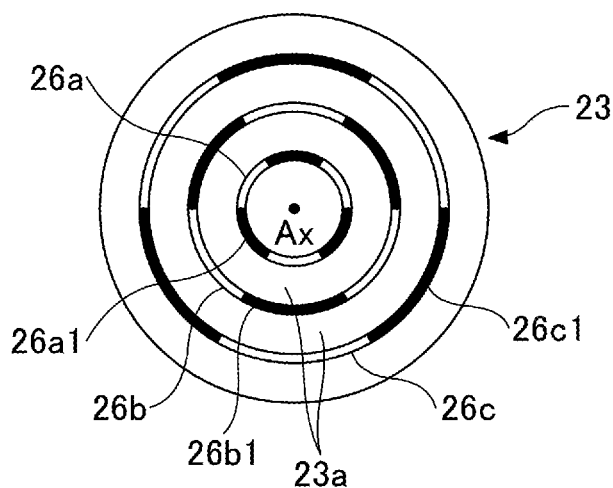
FIG. 6A is a view illustrating the fin member in the trap device according to the second embodiment.
Figure 6B:
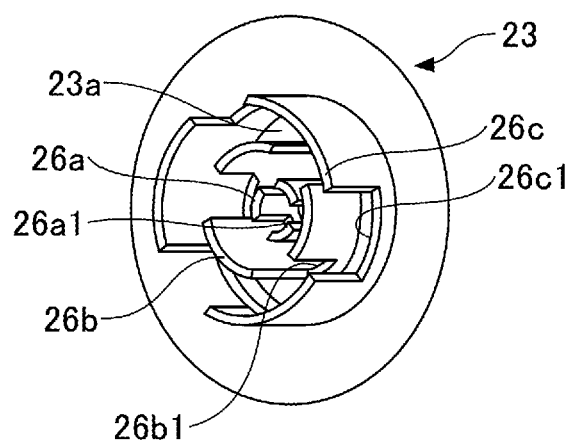
FIG. 6B is a view illustrating the fin member in the trap device according to the second embodiment.

The configuration of the trap device 20 according to the second embodiment will be described next with reference to FIGS. 5, 6A, and 6B. FIG. 5 is a vertical cross-sectional view of the trap device 20 according to the second embodiment. FIGS. 6A and 6B are views illustrating the fin member 23 included in the trap device 20 according to the second embodiment. FIG. 6A is a plan view taken along a plane A-A of FIG. 5 of the fin member 23 according to the second embodiment. FIG. 6B is a perspective view of the fin member 23 according to the second embodiment.

The trap device 20 of the second embodiment differs from the trap device 20 of the first embodiment in only the configuration of the fins 26a, 26b, and 26c of the fin member 23, and other configurations are the same as those of the first embodiment. Hence, the configuration of the fins 26a, 26b, and 26c will be described below, and a description of other configurations of the trap device 20 will be omitted.

As illustrated in FIGS. 5, 6A, and 6B, the plurality of fins 26a, 26b, and 26c according to the second embodiment are arranged concentrically about the central axis Ax and are disposed spaced apart from each other at equal intervals in a radial direction. The fins 26a, 26b, and 26c according to the second embodiment include cutouts 26a1, 26b1, and 26c1, respectively, each having a comb shape. The cutouts 26a1 form recessed openings in the fin 26a, the cutouts 26b1 form recessed openings in the fin 26b, and the cutouts 26c1 form recessed openings in the fin 26c.

The fins 26a, 26b, and 26c are configured such that the respective lengths by which the fins 26a, 26b, and 26c extend from the base 23a of the fin member 23 are longer toward an outer fin. That is, the length by which the fin 26 extends from the base 23a is longest for the outermost fin 26c, followed by middle fin 26b, and the innermost fin 26a in this order.

The cutouts 26a1 include three cutouts that are formed at equal intervals along the circumference of the fin 26a. The cutouts 26b1 include three cutouts that are formed at equal intervals along the circumference of the fin 26b. The cutouts 26c1 include three cutouts that are formed at equal intervals along the circumference of the fin 26c.

As illustrated in FIGS. 6A and 6B, the respective cutouts 26a1 and 26b1 of the fins 26a and 26b that are next to each other are arranged in an alternate manner so as not to overlap each other. Further, the respective cutouts 26b1 and 26c1 of the fins 26b and 26c that are next to each other are arranged in an alternate manner so as not to overlap each other.

Such a configuration allows the exhaust gas led out from the outlet 32 to hit the base 23a of the fins 26a, 26b, and 26c at a substantially right angle, thereby allowing the exhaust gas to pass through the cutouts 26a1 of the fin 26a, the cutouts 26b1 of the fin 26b, and the cutouts 26c1 of the 26c when the exhaust gas flows into the respective inner portions of the fins 26a, 26b, and 26c. Hence, the exhaust gas can flow into the deep portions of the fin member 23 more easily, and the flow of the exhaust gas inside of the fin member 23 can be further improved.

In addition, to prevent the respective cutouts of the neighboring fins 26a, 26b, and 26c from overlapping each other, the cutouts 26a1, 26b1, and 26c1 are arranged in an alternate manner. Such an arrangement allows the exhaust gas that passes through the cutouts 26a1, 26b1, and 26c1 to collide with the walls of the neighboring fins 26 more easily. Thus, it is possible to achieve a configuration in which the exhaust gas is caused to actively collide with the cooled fins 26 such that resolidification of the byproducts R contained in the exhaust gas is easily promoted. As a result, the amount of the byproducts R that can be trapped inside of the fin member 23 can be increased, thus improving the entrapment efficiency of the trap device 20.

Furthermore, the fins 26a, 26b, and 26c are configured such that the respective lengths by which the fins 26a, 26b, and 26c extend from the base 23a of the fin member 23 are longer toward an outer fin. That is, the length by which the fin 26 extends toward the pipe 21b is longest for the outermost fin 26c, followed by the middle fin 26b, and the innermost fin 26a in this order. As a result, when the exhaust gas that passed through the cutouts 26a1, 26b1, and 26c1 flows inside of the fin member 23, the exhaust gas can collide more easily with the all of the surfaces of the fins 26a, 26b, and 26c, and thus the entrapment efficiency of the trap device 20 can be improved.

Hence, it is preferable for the fins 26a, 26b, and 26c to be configured such that the respective lengths by which the fins 26a, 26b, and 26c extend from the base 23a of the fin member 23 are longer toward an outer fin. Note, however, that the respective lengths of the fins 26a, 26b, and 26c are not limited to this. In a similar manner to the first embodiment, the fins 26a, 26b, and 26c may be configured such that the respective lengths by which the fins 26a, 26b, and 26c extend from the base 23a of the fin member 23 are the same or such that the respective lengths by which the fins 26a, 26b, and 26c extend from the base 23a of the fin member 23 are longer toward an inner fin. Alternatively, the middle fin 26b may be configured to be longer or shorter than the innermost fin 26a and the outermost fin 26c.

Although three fins are illustrated in FIGS. 5, 6A, and 6B as the plurality of fins 26, the number of fins are not limited to this, and one, two, or four or more fins may be provided. Further, although it is preferable for all of the fins 26a, 26b, and 26c to include cutouts as in this embodiment, the configuration is not limited to this. It may be configured so that at least one of the fins 26a, 26b, or 26c includes the cutouts. Furthermore, although the fins 26a, 26b, and 26c each include three cutouts in this embodiment, the configuration is not limited to this. The number of cutouts to be included in each of the fins 26a, 26b, and 26c may be the same or may be different among the fins 26a, 26b, and 26c.

According to the trap device 20 of the second embodiment described above, the exhaust gas that flowed through the first exhaust path 31 hits the base 23a of the fins 26 at a substantially right angle, is turned back within the fins 26 to the opposite direction of the flow in the first exhaust path 31, and subsequently flows into the second exhaust path 33. Particularly, in the second embodiment, the flow of the exhaust gas inside of the fin member 23 can be further improved by providing the cutouts 26a1 in the fin 26a, the cutouts 26b1 in the fin 26b, and the cutouts 26c1 in the fin 26c.

Hence, the exhaust gas can flow into the deep portions of the fins 26, pass through the alternately arranged cutouts 26a1, 26b1, and 26c1, and collide with the walls of the fins 26a, 26b, and 26c such that the amount of the byproducts R trapped by the fin member 23 can be further increased. As a result, the efficiency by which the trap device 20 traps the byproducts R can be improved. Furthermore, by providing a configuration in which the exhaust gas is turned back by being passed through the fin member 23 from the first exhaust path 31 to flow into the second exhaust path 33, the entrapment efficiency can be improved. Therefore, the life of the trap device 20 can be further increased.

As described above, according to the trap device 20 of this embodiment, the shape of the fins 26 of the fin member 23 provided at a position facing the exhaust gas introduction pipe 21 can be optimized to improve the efficiency of trapping the byproducts R contained in the exhaust gas.

The trap device and the semiconductor manufacturing device according to the embodiments disclosed herein are merely examples in all respects and are not intended to limit the present invention. Various modifications and changes can be made to the embodiments without departing from the scope and the spirit of the appended claims. Aspects described in the above embodiments can be applied to or combined with other configurations to the extent that are not contradictory.

The semiconductor manufacturing device incorporating the trap device according to the present disclosure is applicable to any type of the following devices such as an atomic layer deposition (ALD) device, a capacitively coupled plasma (CCP) device, an inductively coupled plasma (ICP) device, a radial line slot antenna (RLSA) device, an electron cyclotron resonance plasma (ECR) device, or a helicon wave plasma (HWP) device.

Furthermore, although a plasma processing device has been described as an example of the semiconductor manufacturing device incorporating the trap device according to the present disclosure, the semiconductor manufacturing device is not limited to the plasma processing device as long as it is a device that performs a given process (for example, a deposition process, an etching process, or the like) on a substrate.

The present application is based on and claims priority to Japanese Patent Application No. 2020-107117, filed on Jun. 22, 2020, the entire contents of which are hereby incorporated herein by reference.

DESCRIPTION OF THE REFERENCE NUMERALS 1 chamber
2 plasma
4 lower electrode
10 semiconductor manufacturing device
20 trap device
21 exhaust gas introduction pipe
22 exhaust path forming member
23 fin member
24 cooling jacket
31 first exhaust path
33 second exhaust path
34 third exhaust path
35 fourth exhaust path
37 exhaust vent
40 controller
L exhaust line
ST stage
R byproduct
W substrate

The invention claimed is:

1. A trap device comprising:
an exhaust gas introduction pipe configured to allow an exhaust gas to flow and be led out from an outlet;
a fin member provided in a position where the fin member faces the outlet and is hit by the exhaust gas led out from the outlet;
an exhaust path forming member covering at least a portion of the exhaust gas introduction pipe and including an exhaust path configured to exhaust the exhaust gas such that the exhaust gas is turned back, via the fin member, in an opposite direction to a direction of flow of the exhaust gas in the exhaust gas introduction pipe; and
a cooling jacket configured to cool the fin member,
wherein the fin member includes a fin extending in the opposite direction to the direction of the flow of the exhaust gas in the exhaust gas introduction pipe.

2. The trap device as claimed in claim 1, wherein the fin includes a cutout that is comb-shaped.

3. The trap device as claimed in claim 2, further comprising a plurality of fins, the plurality of fins including the fin,
wherein the plurality of fins are concentrically arranged, and
wherein the plurality of fins are configured such that the respective lengths by which the plurality of fins extend from a base of the fin member are longer toward an outer fin.

4. The trap device as claimed in claim 2, further comprising a plurality of fins, the plurality of fins including the fin,
wherein the plurality of fins each include the cutout, and
wherein the respective cutouts of the fins that are next to each other are arranged in an alternate manner.

5. The trap device as claimed in claim 2, further comprising a plurality of cutouts, the plurality of cutouts including the cutout,
wherein the plurality of cutouts are provided at equal intervals along a circumference of the fin.

6. The trap device as claimed in claim 2, wherein the cutout in the fin forms a recessed portion.

7. The trap device as claimed in claim 1, further comprising a plurality of fins, the plurality of fins including the fin,
wherein the plurality of fins are concentrically arranged, and
wherein the plurality of fins are disposed spaced apart from each other at equal intervals in a radial direction.

8. The trap device as claimed in claim 1, wherein the fin member is disposed at a position where the exhaust gas flowing in the exhaust gas introduction pipe hits the fin member at a substantially right angle.

9. A semiconductor manufacturing device comprising:
a chamber; and
a trap device configured to be connected to the chamber,
wherein the trap device includes
an exhaust gas introduction pipe configured to allow an exhaust gas to flow and be led out from an outlet,
a fin member provided in a position where the fin member faces the outlet and is hit by the exhaust gas led out from the outlet,
an exhaust path forming member covering at least a portion of the exhaust gas introduction pipe and including an exhaust path configured to exhaust the exhaust gas such that the exhaust gas is turned back, via the fin member, in an opposite direction to a direction of flow of the exhaust gas in the exhaust gas introduction pipe, and
a cooling jacket configured to cool the fin member,
wherein the fin member includes a fin extending in the opposite direction to the direction of the flow of the exhaust gas in the exhaust gas introduction pipe.

* * * * *